United States Patent
Ledru et al.

[11] Patent Number: 5,997,616
[45] Date of Patent: Dec. 7, 1999

[54] MOISTURE ABSORPTION DEVICE FOR ELECTRICAL APPARATUS CONTAINING DIELECTRIC GAS

[75] Inventors: Roger Ledru, Tignieu; Antoine Tolossi, Beynost, both of France

[73] Assignee: GEC Alsthom T & D SA, Paris, France

[21] Appl. No.: 09/102,657

[22] Filed: Jun. 23, 1998

[30] Foreign Application Priority Data

Jun. 26, 1997 [FR] France .................................. 97 08016

[51] Int. Cl.⁶ .................................................. B01D 53/04
[52] U.S. Cl. .............................. 96/113; 55/417; 55/420; 55/DIG. 17; 96/134; 96/138; 96/151
[58] Field of Search .................... 55/417, 420, DIG. 17; 95/117; 96/108, 109, 113, 116, 134, 135, 151, 138

[56] References Cited

U.S. PATENT DOCUMENTS

| | | | |
|---|---|---|---|
| 3,160,487 | 12/1964 | Risse et al. | 55/417 |
| 3,189,012 | 6/1965 | Humphreys | 55/417 |
| 3,243,560 | 3/1966 | Wilson | 218/43 |
| 3,472,000 | 10/1969 | Glass et al. | 96/113 |
| 4,026,685 | 5/1977 | Grix | 96/113 |
| 4,398,929 | 8/1983 | Segersten | 96/113 |
| 4,487,617 | 12/1984 | Dienes et al. | 96/113 |
| 4,955,994 | 9/1990 | Knight et al. | 96/113 |
| 5,110,327 | 5/1992 | Smith | 96/113 |
| 5,286,282 | 2/1994 | Goodell et al. | 96/113 |
| 5,334,230 | 8/1994 | Sloka | 96/113 |
| 5,899,435 | 5/1999 | Mitsch et al. | 55/417 |

FOREIGN PATENT DOCUMENTS

| | | |
|---|---|---|
| 992593 | 10/1951 | France . |
| 2 087 459 | 12/1971 | France . |
| 2 629 282 A1 | 9/1989 | France . |

*Primary Examiner*—Duane S. Smith
*Attorney, Agent, or Firm*—Sughrue, Mion, Zinn Macpeak & Seas, PLLC

[57] ABSTRACT

A molecular sieve moisture absorption device for electrical apparatus containing a dielectric gas includes a box in which the molecular sieve is placed. The box is closed by a plate provided with a valve through which the inside of the box is evacuated. The plate is held in place on a shoulder of the box by the action of pressure difference between the inside and the outside of the box after the inside of the box has been evacuated. A gasket is placed between the plate and the shoulder to ensure that the inside volume of the box is leakproof. The device can be stored independently of the apparatus. When the device is mounted on the apparatus, evacuating the case of the apparatus causes the plate to separate from the box, thereby putting the molecular sieve into contact with the inside volume to be treated of the case.

4 Claims, 1 Drawing Sheet

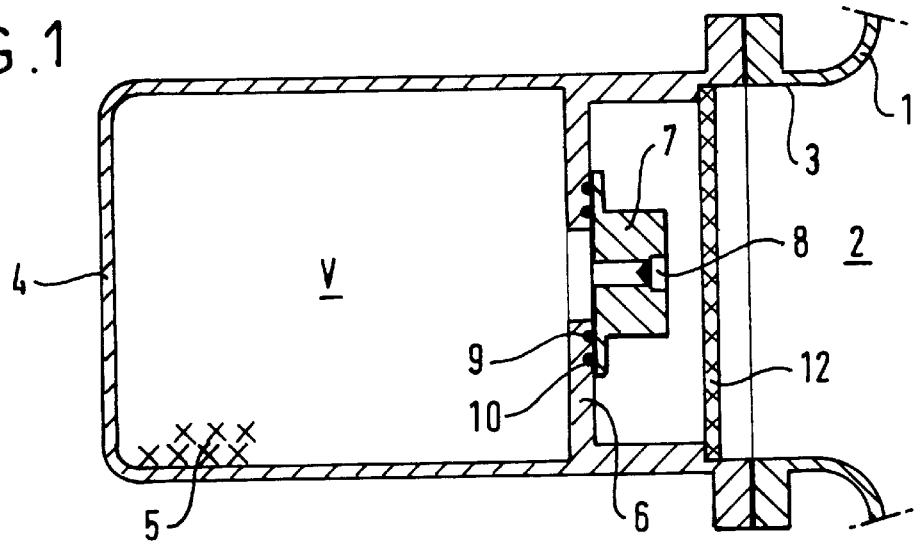
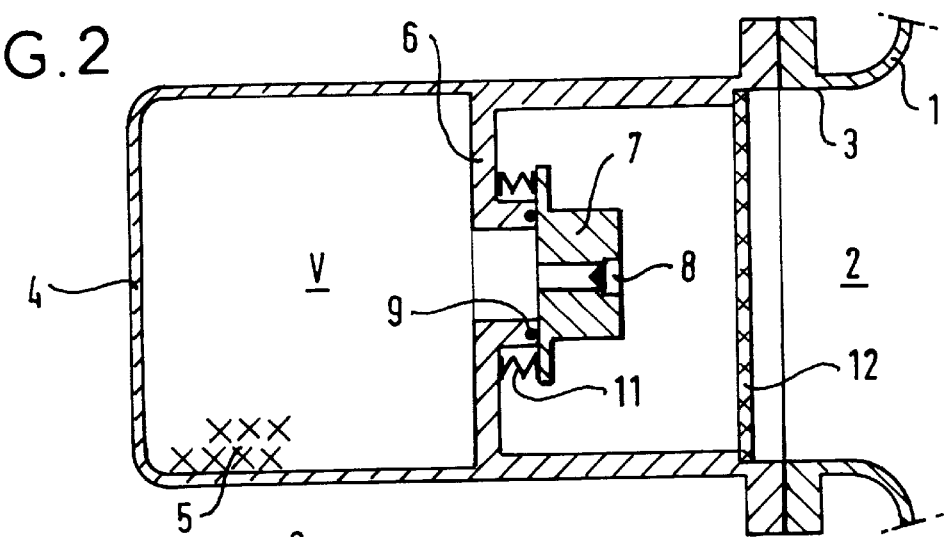
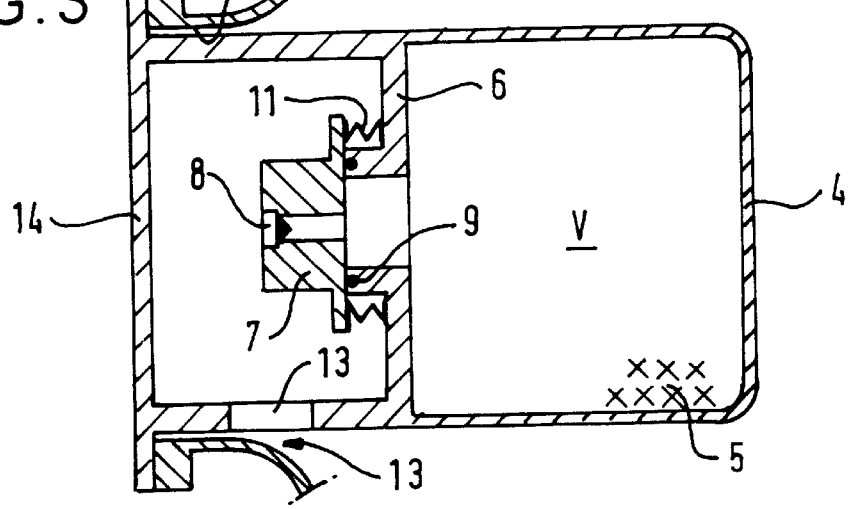

MOISTURE ABSORPTION DEVICE FOR ELECTRICAL APPARATUS CONTAINING DIELECTRIC GAS

The invention relates to electrical apparatuses containing dielectric gas, the apparatus being of the type shielded by metal cladding or having a porcelain case, and more particularly the invention relates to a molecular sieve moisture absorption device for such apparatuses.

BACKGROUND OF THE INVENTION

In electrical apparatus shielded by metal cladding, such as a circuit breaker for example, the molecular sieve used to absorb moisture and decomposition products formed when interrupting, is an aluminosilicate in the form of small crystals or small sticks. The water-hungry molecular sieve is placed in a tubular metal box which is flange-mounted on the neck of an orifice provided through the metal cladding of the apparatus. Prior to commissioning such apparatus, during shipping and storage, a closure plate is placed between the tube containing the molecular sieve and the cladding to avoid contact between the molecular sieve placed in the tube and the air contained inside the cladding. When the electrical apparatus is commissioned, the closure plate is removed to put the inside volume of the tube containing the molecular sieve into communication with the inside volume to be treated of the cladding, and then the apparatus is evacuated prior to being filled with dielectric gas. Removing the closure plate during commissioning of the apparatus thus requires the flange-mounting to be taken apart and then reassembled to hold the tube to the cladding.

OBJECT AND SUMMARY OF THE INVENTION

The object of the invention is to provide a molecular sieve moisture absorption device designed to avoid the above operations of taking apart and reassembling the flange-mounting prior to commissioning such electrical apparatus.

To this end, the invention provides a molecular sieve moisture absorption device for electrical apparatus containing a dielectric gas, the device comprising a box in which the molecular sieve is placed, wherein:

the box is closed by a plate provided with a valve through which the inside of the box is evacuated;

the plate is held in place on a shoulder of the box by the action of a pressure difference between the inside and the outside of the box after a vacuum has been established inside the box; and at least a first gasket is placed between the plate and the shoulder to seal the inside volume of the box.

Such a disposition makes it possible to store the moisture absorption device independently of the apparatus to be treated since the moisture absorption substance is not in contact with the air inside the box.

When the device is mounted on an electrical apparatus which has not yet been commissioned, the assembly can continue to be stored without any risk of the moisture absorption substance being degraded. When a vacuum is established inside the cladding, the substance is put into contact with the inside volume of the cladding of the apparatus without needing to be taken apart, with the plate being separated from the box by the resultant of the pressure forces acting on the plate. In addition, on becoming separated from the box, the noise made by the plate dropping inside the box makes it easy to check that the substance has indeed been put into contact with the inside volume to be treated of the cladding.

BRIEF DESCRIPTION OF THE DRAWING

Other characteristics and advantages appear better on reading the following description of embodiments of the invention as illustrated in the drawing.

FIG. 1 is a highly diagrammatic axial section of a first embodiment of a moisture absorption device of the invention, FIG. 2 is a highly diagrammatic axial section of a second embodiment of a moisture absorption device of the invention.

FIG. 3 is a highly diagrammatic axial section of a third embodiment of a moisture absorption device of the invention.

MORE DETAILED DESCRIPTION

The molecular sieve moisture absorption device of the invention is designed for any electrical apparatus which, in operation, contains a dielectric gas under pressure inside a leakproof case (metal-clad link, disconnector, circuit breaker, set of bus bars, etc. . . . ).

The figures show a fragment of a leakproof case 1 of such electrical apparatus. It has an orifice 2 with a neck 3 on which the moisture absorption device of the invention is flange-mounted. In the embodiment of FIGS. 1 and 2, the absorption device is fixed on the outside of the case of electrical apparatus of the metal clad type. The moisture absorption device shown in FIG. 3 is mounted inside a metal case defining an interrupter chamber for a circuit breaker, for example.

As can be seen in FIG. 1, the moisture absorption device comprises a box, in this case a metal tube 4, whose opening is flange-mounted on the neck of the orifice in the case.

The molecular sieve 5 is placed in the end of the tube 4. A shoulder 6 extending radially inside the tube 4 serves as a support for a plate 7 which closes the volume V containing the molecular sieve. The plate 7 is provided with a valve 8 which is used to evacuate the inside of said volume so as to keep intact the molecular sieve packaged in this way. This volume is made leakproof by a gasket 9 placed between the plate and the shoulder. When the inside of this volume is evacuated, the plate stays in place because of the pressure difference between said volume and the volume outside the box.

When the inside of the case which communicates via its orifice 2 with the plate 7 is evacuated, then the plate 7 is no longer held by the effect of pressure and it separates from the box, e.g. by gravity. When it drops inside the box it produces a noise which makes it possible to verify that the volume v containing the molecular sieve has indeed been put into communication with the inside volume of the case, and thus that said substance is in contact with the volume to be treated of the apparatus. The noise can also be generated by shaking the apparatus.

To ensure that separation between the plate and the shoulder is even more effective (particularly if the gasket 9 is stuck between the plate and the shoulder), it is possible to provide a second gasket 10 disposed around the first gasket between the plate and the shoulder. When the case is evacuated, the resultant of the pressure forces acting on the two gaskets causes the plate to be unstuck from the shoulder.

This separation can be further improved by the presence of a spring 11 which is compressed to act between the box and the plate, as shown in FIGS. 2 and 3. The plate is thus ejected from the box when the envelope to be treated is evacuated regardless of its position relative to the vertical.

A protective grid 12 disposed over the orifice 2 of the case prevents the plate from penetrating inside the case when it separates from the box.

In FIGS. 1 and 2, it can be seen that the box is mounted on the case to be treated in such a manner that the plate and its valve are placed on the side of the case for protection reasons.

In FIG. 3, the box 4 is mounted in the inside volume of the case. Under such circumstances, an opening 13 is provided through the wall of the box to put the volume of the case into communication with the plate and to reach the valve so as to establish a vacuum inside the box. In this configuration, a grid is not necessary and is replaced by an end wall 14 which is flange-mounted on the neck of the orifice in the case.

We claim:

1. A molecular sieve moisture absorption device for electrical apparatus containing a dielectric gas, the device comprising a box in which the molecular sieve is placed, wherein:

the box is closed by a plate provided with a valve through which the inside of the box is evacuated;

the plate is held in place on a shoulder of the box by the action of a pressure difference between the inside and the outside of the box after a vacuum has been established inside the box; and at least a first gasket is placed between the plate and the shoulder to seal the inside volume of the box.

2. The device of claim 1, in which a second gasket is placed around the first gasket, between the shoulder and the plate.

3. The device of claim 1, in which a spring is placed to act between the plate and the box.

4. Electrical apparatus having a case on which a device according to claim 1 is fixed at the location of an orifice through the case, a grid also being provided at said orifice to prevent the plate from penetrating into the inside of the case on being separated from the box.

* * * * *